United States Patent [19]

Beranger et al.

[11] Patent Number: 4,592,023

[45] Date of Patent: May 27, 1986

[54] LATCH FOR STORING A DATA BIT AND A STORE INCORPORATING SAID LATCH

[75] Inventors: Hervé Beranger, Fontainebleau; Armand Brunin, Le Mee; Jean-Paul Rousseau, Perthes, all of France

[73] Assignee: International Business Machines Corporation, Armonk, N.Y.

[21] Appl. No.: 623,052

[22] Filed: Jun. 21, 1984

[30] Foreign Application Priority Data

Oct. 28, 1983 [EP] European Pat. Off. ........ 83430036.0

[51] Int. Cl.⁴ ............................................. G11C 7/00
[52] U.S. Cl. .................................... 365/189; 365/154; 365/174
[58] Field of Search ................. 365/189, 154, 174, 177

[56] References Cited

U.S. PATENT DOCUMENTS 3,504,350  3/1970  Stone .................................. 365/154

OTHER PUBLICATIONS

H. O. Askin et al., "Glitchless Latch With Extendable Ports to L1 Stage", IBM Technical Disclosure Bulletin, vol. 25, No. 3A, Aug. 1982, pp. 1026–1027.
J. F. Joudinaud et al., "Latch T²L Circuit", IBM Technical Disclosure Bulletin, vol. 21, No. 7, Dec. 1978, pp. 2866–2867.

Primary Examiner—Joseph A. Popek
Attorney, Agent, or Firm—Wesley DeBruin

[57] ABSTRACT

A latch that can serve as a bit storage cell in a random-access store. The latch includes an AND gate (diodes D1 and D2) the input IN of which receives the bit to be stored and the other input of which is connected to a write control line WRL. When no write operation is being performed, transistor T1 is turned off and the state of transistor T2 is dependent on output potential OUT. To perform a write operation, line WRL is activated (goes high) and the state of transistor T3 will depend on the value of the bit applied to input IN. Read operations are performed by means of another AND gate (diodes D4 and D5) and an emitter follower (transistor T4) connected via a bit line BL to an output circuit 2. By adding input transistors and emitter followers to the latch, a multi-port storage can be realized, several rows of which can be simultaneously written into and/or read out.

12 Claims, 6 Drawing Figures

| | 8 CELLS. | 12 CELLS. | | 12 CELLS. | 16 CELLS. | | 16 CELLS. |
|---|---|---|---|---|---|---|---|
| 8 R/W CTRL CKTS | 8 WORDS 8 x 8 MATRIX | 8 WORDS 8 x 12 MATRIX | 8 R/W CTRL CKTS | 8 WORDS 8 x 12 MATRIX | 8 WORDS 8 x 16 MATRIX | 8 R/W CTRL CKTS | 8 WORDS 8 x 16 MATRIX |
| | 8 OUTPUT CKTS | 12 OUTPUT CKTS | | 12 OUTPUT CKTS | 16 OUTPUT CKTS | | 16 OUTPUT CKTS |

FIG. 6

LATCH FOR STORING A DATA BIT AND A STORE INCORPORATING SAID LATCH

DESCRIPTION

Technical Field

Cross-Reference To Related Applications

U.S. patent application Ser. No. 597958 entitled "Electrically Selectable Redundant Array (ESRA)" filed Apr. 9, 1984 by M. T. McMahon.

U.S. patent application Ser. No 625,426 entitled "Improved Gate Array Chip" filed June 28, 1984 by E. F. Culican et al.

U.S. patent application Ser. No. 611,564 entitled "Dual Mode Logic Circuit For A Memory Array" filed May 18, 1984, by R. L. Barry U.S. patent application Ser. No. 624,488 entitled "Improved Random Access Memory RAM Employing Complementary Transistor Switch (CTS) Memory Cells" filed June 25, 1984, by Y. H. Chan et al.

U.S. patent application Ser. No. 624,486 entitled "Voltage Mode Operation Scheme For Bipolar Arrays" filed June 25, 1984, by Y. H. Chan et al.

U.S. patent application Ser. No. 611, 817 entitled "Self Contained Array Timing" filed May 18, 1984 by W. S. Klara et al.

This invention relates to a storage cell comprised of a simplified latch, which is particularly suitable for manufacturing low-capacity, fast random-access stores.

PRIOR ART

Existing random-access stores are usually comprised of Harper cells or of modified Harper cells incorporating additional PNP transistors. The conventional layout used in these stores does not lend itself to the implementation of low-capacity stores because, taking the size of the cells and the peripheral circuits into account, the average semiconductor chip area required to store one bit is too large. Also, in stores of this type, the supply voltages are comparatively high (at least 3.4 volts), resulting in an excessive power dissipation.

SUMMARY OF THE INVENTION

It is, therefore, an object of this invention to provide a simplified storage cell that allows the use of small size peripheral circuits to form a random-access store.

The latch in which a data bit is to be stored is mainly comprised of three transistors. Each transistor has a control electrode (a base) and two conducting electrodes (an emitter and a collector). In a preferred embodiment, NPN transistors are employed, but these could obviously be replaced by PNP transistors.

The latch comprises a write control circuit that includes a first AND gate (comprised of diodes D1, D2) receiving on a first input the bit to be stored and on a second input a write control signal. A first input transistor (T1) has its base connected to the output of the AND gate, its collector connected to a first supply voltage (V+) through a first resistor (R2), and its emitter connected to a reference potential ($V_{REF}$), so that the state of said transistor is controlled by the output signal from the AND gate. A second transistor (T2) receives on its emitter the write control signal. A third transistor (T3) has its base connected to the collectors of the first and second transistors, its emitter connected to a second supply voltage (V−), and its collector connected, on the one hand, to the base of the second transistor through a signal level shifting circuit, and, on the other hand, to the first supply voltage through a second resistor (R3), so that the potential at the collector of said transistor represents the bit stored in the latch.

A read control circuit comprises an AND gate (comprised of diodes D4, D5) having a first input connected to the collector of the third transistor and a second input supplied with a read control signal, and an output transistor (T4) connected in an emitter-follower configuration having its base connected to the output of the AND gate, its collector connected to said first supply voltage, and its emitter connected to a read output circuit.

This latch can be used as a storage cell in a random-access store comprising a matrix of cells. In each row, the second input of the AND gate associated with the write control circuit of each latch is connected to a write control line to receive, whenever the row is selected, the write control signal that will cause the bit fed to the first input of said AND gate in each latch to be stored therein.

Similarly, in each row, the second input of the AND gate associated with the read control circuit of each latch is connected to a read control line to receive the read control signal whenever the row is selected, and the emitter of the output emitter follower of each latch is connected to a bit line itself connected to the read output circuit.

By adding at least one input transistor and at least one emitter follower to each latch, a structure is obtained which can be used to realize a multi-port random-access store allowing at least two rows to be simultaneously written into and at least two other rows to be simultaneously read out.

These and other objects, features and advantages of the invention will be apparent from the following more particular description of the preferred embodiments of the invention as illustrated in the drawings.

BRIEF DESCRIPTION OF THE DRAWINGS

FIG. 6, in accordance with the invention, discloses an arrangement of several matrices of latches and the circuits associated therewith.

DETAILED DESCRIPTION OF THE INVENTION

Figure 1:
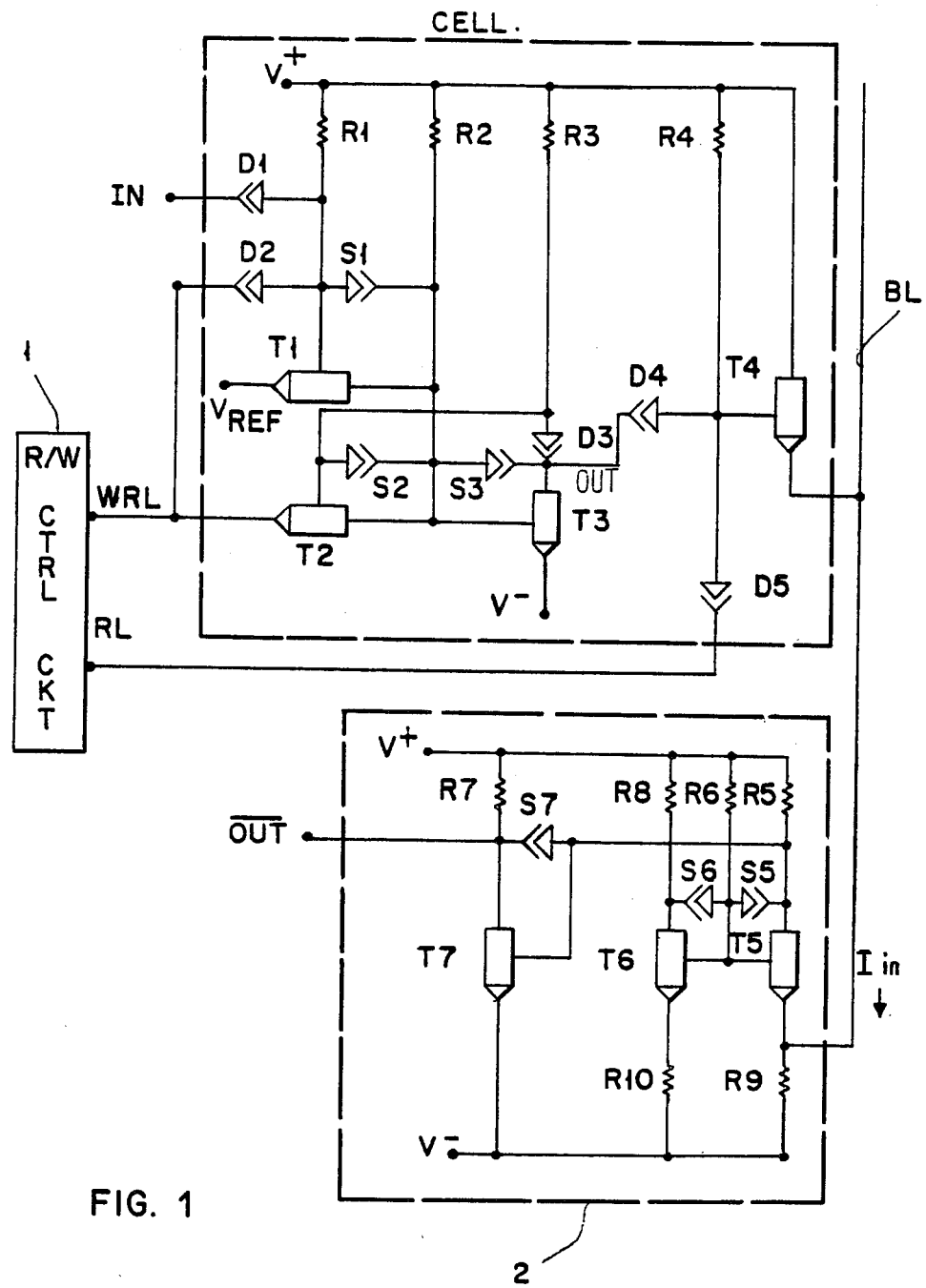
FIG. 1, in accordance with the invention, discloses the simplified latch and an output circuit, both of which can be used in a random-access store.

The storage cell of the present invention is comprised of a simplified latch which, in a preferred embodiment, is supplied with a low voltage (1.7 volt).

The cell comprises three transistors T1, T2 and T3 and an output transistor T4 connected in an emitter-follower configuration. As used in a preferred embodiment, these transistors are of the NPN type. Transistors T1, T2 and T3 are respectively associated with anti-saturation Schottky diodes S1, S2 and S3, each of which has its anode and its cathode respectively connected to the base and the collector of the associated transistor.

The data bit to be written into the cell is fed to input terminal IN. Write operations are performed under the control of two Schottky diodes D1 and D2. The anode and the cathode of diode D1 are respectively connected to the base of transistor T1 and to the input terminal. The anode of diode D2 is connected to the anode of D1 and its cathode is connected to the emitter of transistor T2 and to a write control line WRL. Diodes D1 and D2 form an AND gate enabling a 1 bit or a 0 bit applied to input terminal IN of the circuit to be written into the cell when line WRL is activated.

The base and the collector of transistor T1 are connected to a supply voltage V+ through resistors R1 and R2, respectively. The emitter of T1 is connected to a reference voltage VREF.

The collector of T1 is connected to the collector of T2 and the base of T2 is connected to voltage V+ through a resistor R3.

The base and the emitter of transistor T3 are respectively connected to the collector of T2 and to a supply voltage V−. The collector of T3 is connected to the cathode of a Schottky diode D3 which has its anode connected to the base of T2.

The state of the latch is determined by the voltage level at the collector of transistor T3.

The bit stored in the cell is read out by means of an output circuit. In a store comprised of a matrix of cells, such an output circuit is provided for each bit line BL.

The storage cell is connected to the output emitter follower T4. The emitter of transistor T4 is connected to a bit line BL. If a matrix of cells is used, then all transistors T4 associated with the cells of the same column are connected to the same bit line.

The collector of transistor T4 is connected to supply voltage V+. The base of T4 is connected to V+ through a resistor R4, to the output OUT of the latch through a Schottky diode D4, and to read control line RL through a Schottky diode D5. The anodes of diodes D4 and D5 are connected to the base of T4.

The output circuit comprises three transistors T5, T6 ans T7 with which anti-saturation Schottky diodes S5, S6 and S7 are associated.

The emitter of transistor T5 is connected to bit line BL and its collector is connected through a resistor R5 to supply voltage V+. The bases of T5 and T6 are connected through a resistor R6 to V+. The collector of T6 is connected to V+ through a resistor R8. The emitters of T5 and T6 are connected to supply voltage V− through resistors R9 and R10, respectively.

The base and the emitter of transistor T7 are respectively connected to the collector of T5 and to voltage V−, while its collector is connected to voltage V+ through a resistor R7.

The output signal indicating the state of the cell is obtained at the collector $\overline{\text{OUT}}$ of transistor T7.

In a preferred embodiment, the transistors in the various cells and output circuits are NPN transistors and the respective values of supply voltages V+ and V− are 1.7 volt and zero volt. The resistors have the following values : R1=20 kΩ, R2=16.5 kΩ, R3=11 kΩ, R4=15 kΩ, R5=R8=11 kΩ, R6=15 kΩ, R7=8 kΩ, R9=2 kΩ and R10=2.2 kΩ.

A Read/write control circuit 1 supplies control signals on lines RL and WRL to cause bits to be read out of the cell or written therein.

The operation of the cell will now be described.

When no write or read operation is to be performed, write line WRL is at a low logical level. Thus, transistor T2 is on if the cell output is at a high logical level, and transistor T1 is off since the current flowing in resistor R1 passes through diode D2, which is then conducting.

To perform a write operation, line WRL is raised by R/W control circuit 1. As a result, transistor T2 and diode D2 are both turned off, so that the current flowing in resistor R1 cannot pass through D2.

If the signal applied to bit input IN is low, then diode D1 is turned on and the current flowing in resistor R1 passes through D1, thereby turning T1 off. Since T1 and T2 are simultaneously turned off, the current flowing in resistor R2 turns transistor T3 on, so that the signal at output OUT is low. The current in R3 passes through diode D3, so that T2 cannot turn on even when write line WRL goes low again.

If the signal applied to input IN is high, then the current flowing in resistor R1 causes transistor T1 to turn on. Transistor T3 is off and transistor T2 will turn on when write line WRL goes low again.

The function of diode D3 is as follows. If the base of transistor T2 were directly connected to the collector of transistor T3, circuit operation would be slower, because both the voltage excursion at the base of T2 and the effect of the parasitic capacitance would be more significant, and the dissipation of power would increase because, with T3 conducting, the voltage drop across R3 would increase and more current would flow in resistor R3.

A resistor could be substitued for diode D3, but the effect of this change would be to increase the parasitic capacitances and the chip area required. The use of a diode eliminates the need to provide a collector contact for T3 and cathode contacts for diodes D3 and D4, since D3, D4 and T3 can be formed in the same epitaxial bed and since access to the collector of T3 is unnecessary.

The purpose of emitter follower T4 is to reduce the output capacitance when the number of cells connected to the same bit line increases and, consequently, to prevent the read time from increasing.

Since the value of supply voltage V+, which may be as low as 1.46 volt, is insufficient to drive a conventional TTL gate, the output circuit is comprised of a high-gain amplifier the threshold value of which is adjusted to match the reference voltage VREF fed to the emitter of transistor T1 in the cell, thereby ensuring a short read time. The operation of the output circuit will be described later.

Because its collector is directly connected to supply voltage V+, transistor T4 can be formed in the epitaxial bed of the resistors and, consequently, only occupies the base-emitter junction area.

The contents of the cell are read out under the control of diodes D4 and D5, which form an AND gate. To this end, R/W control circuit 1 raises read line RL. The potential on the base of transistor T4 approaches V+ if the output signal from the cell is high. If the output signal is low, then the current flowing in resistor R4 passes through diode D4, which holds the line at a low logical level.

When transistor T4 is off (a low logical level being obtained at output OUT), no current is fed to the output circuit (Iin=0). Resistors R5 and R8 connected to transistors T5 and T6 have identical values; resistor R6 is connected to the bases of T5 and T6; and resistors R9 and R10 connected to their emitters have slightly different values so that the value of the current flowing in T5 will exceed that of the current flowing in T6. As a result, a current flows in diode S5, T7 is off, and output $\overline{OUT}$ connected to the collector of T7 is at a high logical level.

When transistor T4 is on (a high logical level being present at output OUT), a current Iin is fed to the output circuit, which tends to turn T5 off since its emitter potential increases. The current which previously flowed in diode S5 now flows in diode S6. The base potential of T5 is mainly defined by resistors R6, R10 and R8. When the value of Iin is sufficiently high, T5 is turned off and the current flowing in R5 turns T7 on, so that a low logical level is present at output $\overline{OUT}$.

In summary, the output circuit acts as a differential amplifier comprising transistors T4 and T5, with the base of T5 being connected to a circuit that supplies a reference voltage and with the base of T4 receiving the input signal.

Figure 2:
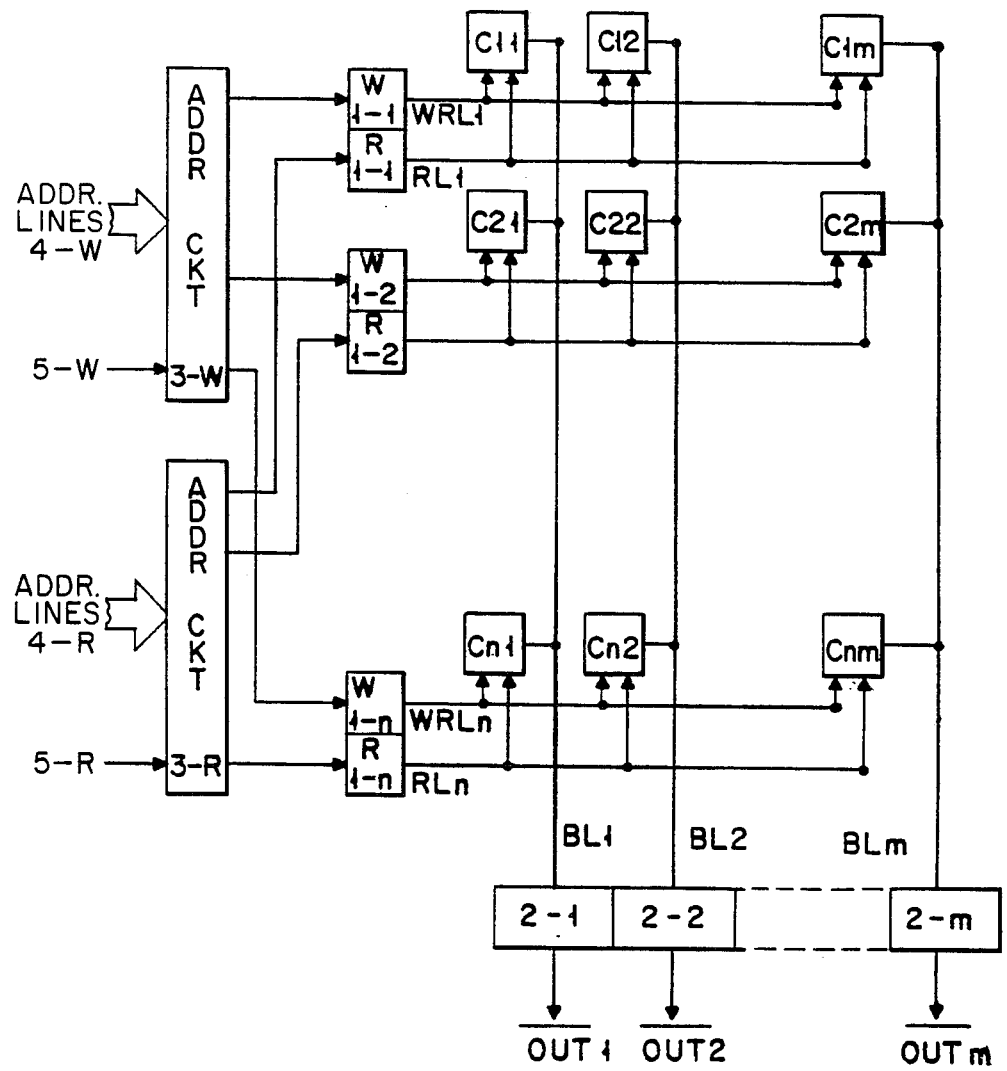
FIG. 2, in accordance with the invention, discloses the matrix arrangement of latches associated with output circuits and forming a store.

The storage cell just described can be used as a building block to form a matrix of n rows and m columns of cells C ij as schematically shown in FIG. 2.

The cells in a given row are selected under the control of Read/Write control circuits R1-1/W1-1 to R1-n/W1-n which supply on write lines WRL1-WRLn and read lines RL1-RLn selection signals for writing bits into the cells of the same row or for reading the contents thereof.

Two addressing circuits, 3-W and 3-R, are provided to permit reading out the contents of a given row and simultaneously writing bits into the cells of another row.

Addressing circuit 3-W receives via lines 4-W the configuration of address bits for the row to be selected and, via line 5-W, a write control signal to cause one of the lines WRL1-WRLn to be activated by one of the associated write control circuits W1-1 to W1-n associated therewith.

Addressing circuit 3-R receives via lines 4-R the configuration of address bits for the row to be selected and, via line 5-R, a read control signal to cause one of the lines RL1-RLn to be activated by one of the read control circuits R1-1 to R1-n associated therewith.

The cells of the same column are connected to bit lines BL1-BLm. The condition of the cells in the row to be read from is detected by output circuits 2-1 to 2-m respectively connected to bit lines BL1-BLm. Circuits 2-1 to 2-m supply signals $\overline{OUT1}$-$\overline{OUTm}$ respectively associated with bit lines BL1-BLm.

By adding control circuits to the above matrix of cells, a storage can be formed in which several rows of cells can be written into while simultaneously reading out the contents of several other rows.

Figure 3:
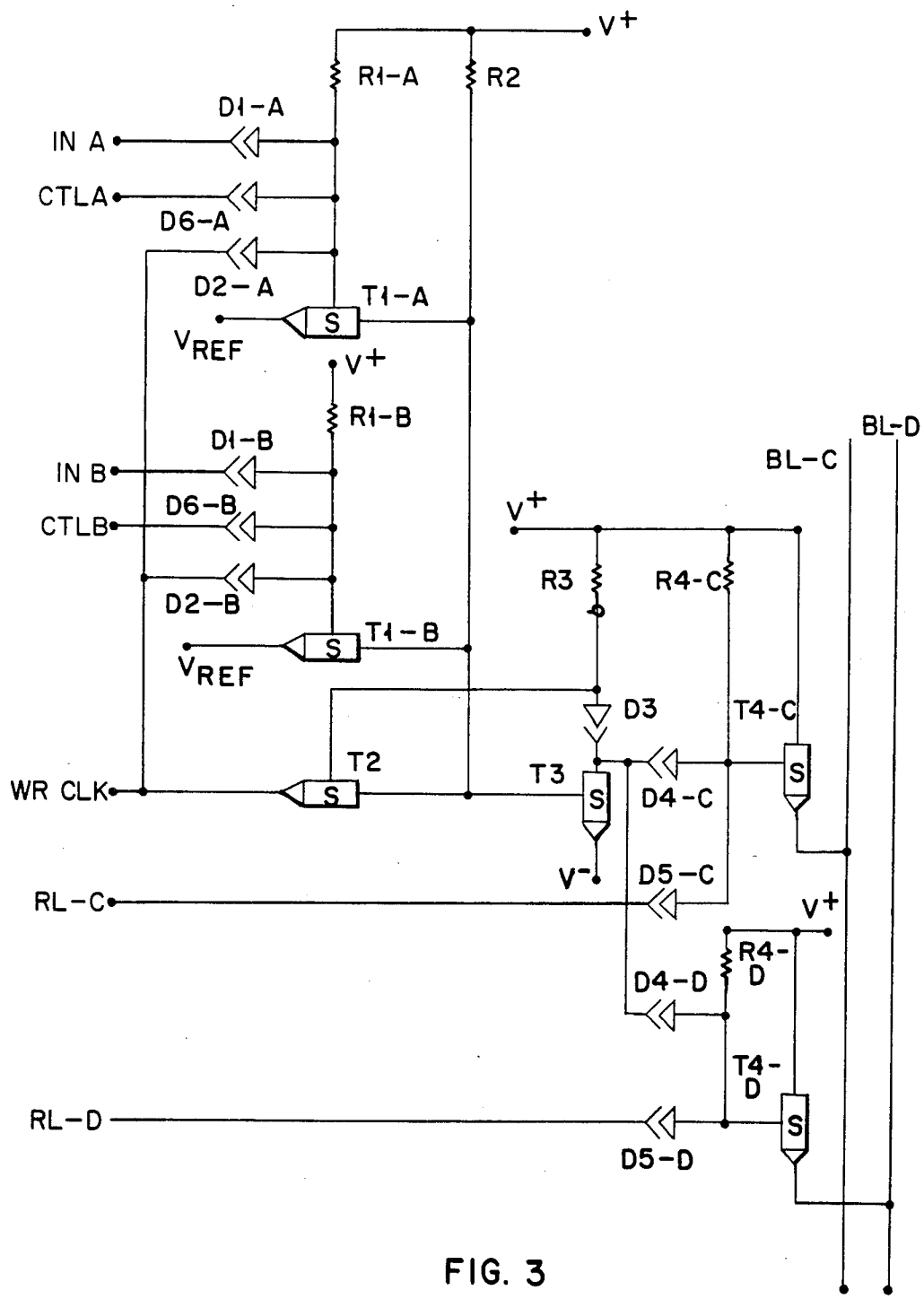
FIG. 3, in accordance with the invention, discloses a latch similar to that of FIG. 1 but including several R/W control circuits.

Referring now to FIG. 3, there are shown the components to be added to a cell to form a storage in which two rows of cells can be written into while simultaneously reading out two other rows.

As will be readily apparent to one skilled in the art, this arrangement can be used to devise a storage in which read and write operations are simultaneously performed in a desired number of rows.

The same reference numerals are used in FIGS. 1 and 3. Suffixes A, B, C and D have been added to the reference numerals of the additional components. The letter S appearing in each transistor indicates that an anti-saturation Schottky diode (not shown) is associated therewith as in FIG. 1.

To write bits into the cells of two separate rows, two transistors, T1-A and T1-B, are provided which receive the two input bits, IN A and IN B, fed to the cathodes of diodes D1-A and D1-B.

Two additional Schottky diodes D6-A and D6-B have their anodes respectively connected to the bases of transistors T1-A and T1-B, and have their cathodes respectively connected to control inputs CTL A and CTL B.

Whenever the selected rows are to be written into, a high signal is applied to the write clock control (WR CLK) inputs of these rows.

In one of the rows, a low signal and a high signal are respectively supplied to write control inputs CTL A and CTL B, while a high signal and a low signal are respectively supplied to write control inputs CTL A and CTL B in the other row.

In the cell in which control input CTL A receives a low signal, diode D6-A is on and transistor T1-A is off, so that the bit applied to input IN A cannot be written. In this same cell, control input CTL B receives a high signal, diode D6-B is turned off, and the bit applied to input IN B is written as described with reference to FIG. 1, with transistor T1-B and diode D1-B performing the same functions as transistor T1 and diode D1.

To enable two rows of cells to be read from simultaneously, two bit lines, BL-C and BL-D, are provided. These are respectively associated with emitter followers T4-C and T4-D which perform the same function as transistor T4 in FIG. 1.

To this and, read control inputs RL-C and RL-D receive read control signals which are supplied to the cathodes of diodes D5-C and D5-D.

Diodes D4-C and D4-D and resistors R4-C and R4-D perform the same functions as diode D4 and resistor R4 in FIG. 1 for each of transistors T4-C and T4-D.

Consequently, if the read control signals on lines RL-C and RL-D are respectively high and low, then diode D5-C is off and diode D5-D is on, so that transistor T4-D is off, and the read operation will be performed by the circuit comprising D4-C, T4-C and bit line BL-C in the manner described with reference to FIG. 1.

If the control signals on lines RL-C and RL-D are respectively low and high, then the read operation will be performed by the circuit comprising D4-D, T4-D and bit line BL-D.

An output circuit 2 identical to that shown in FIG. 1 is associated with each bit line.

Figure 4:
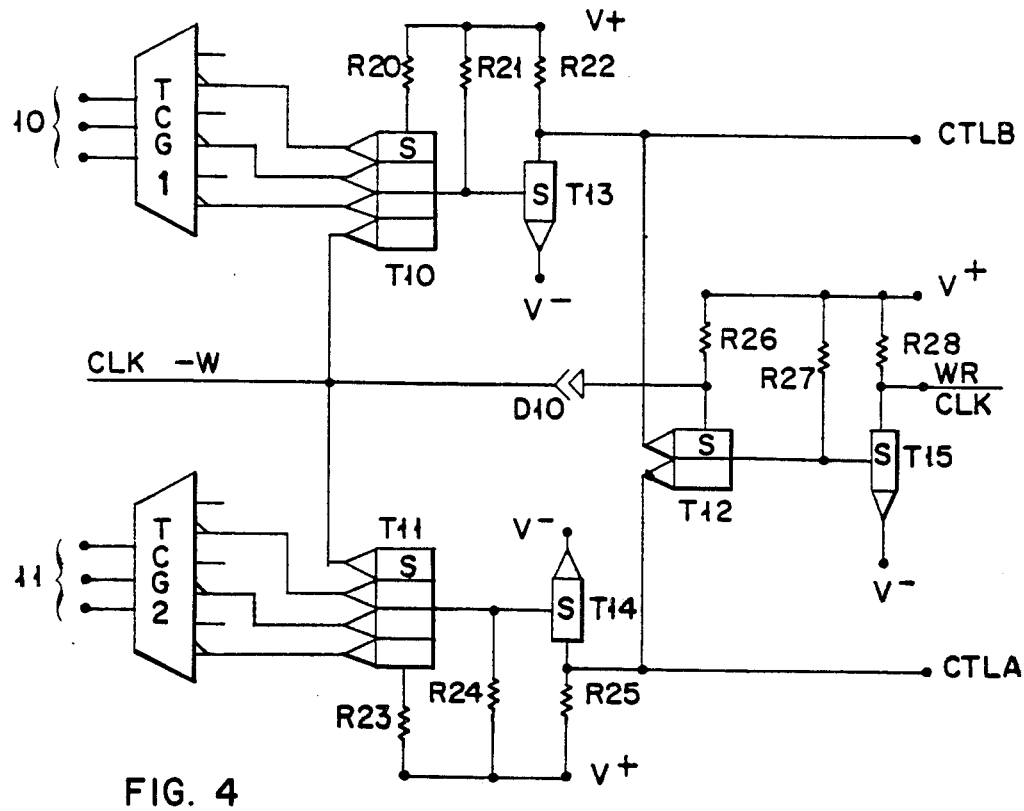
FIG. 4, in accordance with the invention, discloses a circuit for generating write control signals.

Referring now to FIG. 4, the control circuit that generates control signals on lines CTL A, CTL B and WR CLK is illustrated.

In the arrangement shown, it has been assumed by way of example that the store comprises eight rows that can be addressed by means of a 3-bit address.

A first generator of true/complement values TCG 1 receives on its inputs 10 the address bits for one of the rows to be selected, and a second generator of true/-component values TCG2 receives on its inputs 11 the address bits for the other row to be selected.

These generators supply on their output lines the true and complement values of the input address bits, the complement value being provided on the line shown thus.

Three control circuits which include three multiple-emitter transistors T10, T11, T12 are associated with each row of storage cells. The illustrated control circuits are those associated with the row of address 000.

Three of the emitters of transistors T10 and T11 are connected to the outputs of generators TGC1 and TGC2, all of which are at high or "1" logical level when the corresponding row is addressed. In the instance of row 000, the emitters are connected to the complement outputs. The fourth emitter receives a write clock signal CLK-W.

The bases of T10 and T11 are connected to supply voltage V+ via resistors R20 and R23, respectively, and their collectors are connected to V+ via resistors R21 and R24 and to the bases of transistors T13 and T14. The collectors of T13 and T14 are connected to V+ via resistors R22 and R25, and their emitters are connected to voltage V−. Control signals CTL B and CTL A are obtained at the collectors of T13 and T14.

The emitters of transistor T12 are connected to the collectors of T13 and T14. The base of T12 is connected to V+ via resistor R26 and its collector is connected to V+ via resistor R27 as well as to the base of T15. The collector of T15 is connected to V+ via resistor R28 and its emitter is connected to V−. Control signal WR CLK is taken from the collector of T15. CLock signal CLK-W is supplied to the base of T12 through Schottky diode D10.

The operation of the circuit is as follows:

Assuming that row 000 is the first row to be addressed for the purpose of a write operation, the address 000 will be applied to the input of generator TGC1 and the address of the other row to be selected, for example 001, will be applied to the input of generator TGC2. Write clock signal CLK-W will be high.

All of the emitters of T10 will be at a high level and at least one of the emitters of T11 will be at a low level. Consequently, T10 will be off and T11 will be on.

Transistor T13 will be on, so that the signal on line CTL B will be low. T14 will be off and the signal on line CTL A will be high.

Transistor T12 will be on and T15 will be off, hence the signal on line WR CLK will be high.

The function of diode D10 is to reshape the trailing edge of write clock pulse CLK-W.

Thus, the signals on lines CTL A, CTL B and WR CLK will be at the required levels to cause the data bits applied to input IN A to be written into the cells of the selected row (000).

In the other selected row (001), transistor T11 will be off and transistor T10 will be on, so that the signal levels on lines CTL B, CTL A and WR CLK will cause the bits applied to input IN B to be written into the cells of this row.

In all other rows, T10 and T11 will be on and the signal levels on lines CTL B and CTL A will be high. Accordingly, T12 will be off and T15 will conduct, and a low signal level will be present on line WR CLK. No write operation can be performed under such conditions.

In the event of the same configuration of address bits being erroneously applied to both generators TCG1 and TCG2, a zero will be written into all cells of the row having that address since lines CTL A and CTL B will both be low.

Figure 5:
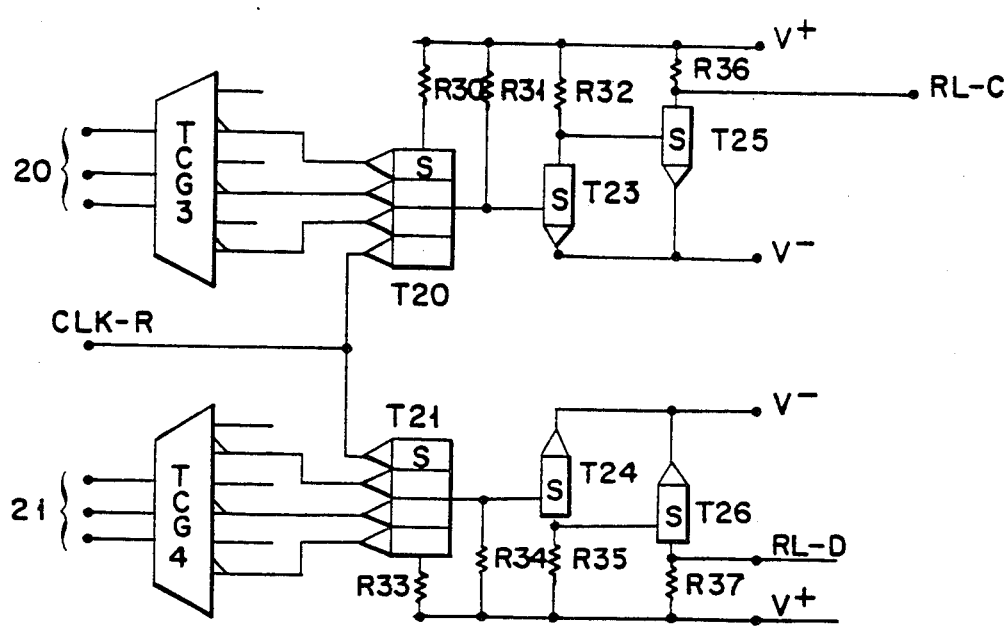
FIG. 5, in accordance with the invention, discloses a circuit for generating read control signals.

The read control circuits are simpler since no WR CLK line is required. The read control circuits for a row such as row 000 are shown in FIG. 5.

To enable read operations, two additional generators of true/complement values TCG3 and TCG4 are provided, the respective inputs 20 and 21 of which receive the configurations of address bits for the rows to be selected. A read clock signal CLK-R goes high to enable the contents of selected rows to be read out.

Two multiple-emitter transistors T20 and T21 are provided in each row. These have three of their emitters connected to the outputs of generators TCG3 and TCG4, while the fourth receives clock signal CLK-R. The collectors of transistors T20 and T21 are connected to the bases of transistors T23 and T24 which are arranged in the same manner as transistors T13 and T14 in FIG. 4.

Two inverting transistors T25 and T26 have their bases connected to the collectors of T23 and T24, while their collectors are connected to supply voltage V+ via resistors R36 and R37 and their emitters are connected to voltage V−.

Resistors R30 through R35 are arranged in the same manner as resistors R20 through R25 in FIG. 4 relative to transistors T20, T21, T23 and T24.

Control signals RL-C and RL-D are taken from the collectors of transistors T25 and T26, respectively.

When the read clock signal is high, signals RL-C and RL-D will be at the logical levels required to cause the contents of a first and a second rows to be read out, the addressses of these rows being defined by the bit configurations fed to generators TCG3 and TCG4.

For example, if address bit configurations 000 and 001 are respectively applied to generators TCG3 and TCG4, then signal RL-C for row 000 will be high, thereby causing the contents of the cells in this row to be read out, and signal RL-D for the same row will be low.

Signal RL-C for row 001 will be low and signal RL-D will be high, causing the cells of this second row to be read out.

In all other rows, signals RL-C and RL-D will be low since transistors T20 and T21 in the read control circuits for these rows are conducting.

This control circuit can be used for generating control signals WRL and RL in a store comprised of cells of the type shown in FIG. 1. In this case, one of the generators, say TCG3, would receive the address bits for the row to be selected for the purpose of write operations and the other generator would receive the address bits for the row to be selected for the purpose of read operations.

Transistors T20, T23, T25 and T21, T24, T26 arranged as shown in FIG. 5 are provided for each row.

The emitter of T20 that is not connected to generator TCG3 receives write clock signal CLK-W, and the fourth emitter of T21 that is not connected to generator TCG4 receives read clock signal CLK-R. Control signals WRL and RL are obtained at the collectors of T25 and T26.

In such a store, the read time is about 7 ns. The write lines must be activated during a time interval equal to or exceeding 7 ns for a write operation. The data bits must be maintained at the input of the circuit at least 3 ns beyond the down-going transition of the pulses that enable the write operation.

FIG. 6 is a schematic illustration of a store comprised of three matrices of 8×8, 24×8 and 32×8 cells and the associated R/W control circuits. Such an arrangement requires a chip area of 4.88 mm².

While the invention has been particularly shown and described with reference to a preferred embodiment thereof, it will be understood by those skilled in the art that numerous changes in form and detail may be made therein without departing from the spirit and scope of the invention.

What is claimed is:

1. In a read/write random access memory at least one bistable circuit, said bistable circuit comprising:
   first, second and third transistors each of said first, second and third transistors having an emitter, base and collector, said collectors of said first and second transistors and said base of said third transistor being connected in common, said emitter of said first transistor being connected to a reference source of potential, said emitter of said third transistor being connected to a second potential source;
   a first resistor connected between said base of said first transistor and a first potential source;
   a second resistor connected between said common connection of said collectors of said first and second transistors and said base of said third transistor, and said first potential source;
   a third resistor connected between said base of said second transistor and said first potential source;
   a data-in terminal for receiving a binary data bit;
   a write control input terminal for receiving a write control signal;
   a read control input terminal for receiving a read control signal;
   an output terminal for manifesting the binary state of said bistable circuit;
   a fourth resistor connected between said output terminal and said first potential source;
   a first diode connected between said data-in terminal and said base of said first transistor;
   a second diode connected between said base of said first transistor and a common connection between said write control input terminal and said emitter of said second transistor;
   a third diode connected between said collector of said third transistor and said base of said second transistor; and
   a fourth diode connected between said collector of said third transistor and said output terminal.

2. In a read/write random access memory at least one bistable circuit, said bistable circuit having first and second write ports and first and second read ports, said bistable circuit comprising:
   first, second, third and fourth transistors, each of said first through fourth transistors having an emitter, base and collector, said emitter of said first and second transistors being respectively connected to a reference potential source, said emitter of said fourth transistor being connected to a second potential source, said collectors of said first, second and third transistors and said base of said fourth transistor being connected in common;
   a first resistor connected between said base of said first transistor and a first potential source;
   a second resistor connected between said base of said second transistor and said first potential source;
   a third resistor connected between said common connection of said collectors of said first, second and third transistors and said base of said fourth transistor, and said first potential source;
   a fourth resistor connected between said base of said third transistor and said first potential source;
   said first write port including a first data-in terminal for receiving a binary data bit to be written into said bistable circuit and a first write port control terminal for receiving a first write port control signal;
   said second write port including a second data-in terminal for receiving a binary data bit to be written into said bistable circuit and a second write port control terminal for receiving a second write port control signal;
   a write control input terminal for receiving a write control signal said write control input terminal being connected to said emitter of said third transistor;
   said first read port including a first read port control signal terminal for receiving a first read port control signal and a first read port output terminal for electrically manifesting the binary state of said bistable circuit;
   said second read port including a second read port control signal terminal for receiving a second read port control signal
   and a second read port output terminal for electrically manifesting the binary state of said bistable circuit;
   a fifth resistor conected between said first read port output terminal and said first potential source;
   a sixth resistor connected between said second read port output terminal and said first potential source;
   a first diode connected between said first data-in terminal of said first read port and said base of said first transistor;
   a second diode connected between said first write port control terminal and said base of said first transistor;
   a third diode connected between said base of said first transistor and said common connection of said write control input terminal and said emitter of said third transistor;
   a fourth diode connected between said second data-in terminal of said second read port and said base of said second transistor;
   a fifth diode connected between said second write port control terminal and said base of said second transistor;
   a sixth diode connected between said base of said second transistor and said common connection of said write control input terminal and said emitter of said third transistor;
   a seventh diode connected between the base of said third transistor and the collector of said fourth transistor;
   an eighth diode connected between said collector of said fourth transistor and said first read port output terminal;
   a ninth diode connected between said first read port control signal terminal and said first read port output terminal;
   a tenth diode connected between said collector of said fourth transistor and said second read port output terminal; and,
   an eleventh diode connected between said second read port output terminal and said second read port output terminal.

3. In a read/write random access memory array, said memory array having m columns of memory cells and n rows of memory cells, where m and n are positive integers, and said memory array includes m×n memory cells, said memory array comprising:
   m×n memory cells arranged in an array having m columns and n rows, each of said memory cells having a data-in terminal, a write control input terminal a read control input terminal and an output terminal;

n pairs of control lines, each pair of said n pairs of control lines being associated with a discrete one of said n rows of memory cells, each pair of said n pairs of control lines including a write control line for receiving a write control signal and a read control line for receiving a read control signal, each of said n write control lines of said n pairs of control lines being connected to the write control input terminal of the m memory cells of the row of memory cells associated with said one of said n write control lines, and each of said n read control lines of said n pairs of control lines being connected to the read control input terminal of the m memory cells of the row of memory cells associated with said one of said n read control lines: and, m output circuit means each of said m output circuit means being associated with a discrete one of said m columns of memory cells, each of said m output circuit means being connected to the output terminal of the n memory cells of the column of memory cells associated with said one of said m output circuit means:

4. In a read/write random access memory at least one bistable circuit, said bistable circuit comprising:

first, second and third transistors each of said first, second and third transistors having an emitter, base and collector, said collectors of said first and second transistors and said base of said third transistor being connected in common, said emitter of said first transistor being connected to a reference source of potential, said emitter of said third transistor being connected to a second potential source;

a first resistor connected between said base of said first transistor and a first potential source;

a second resistor connected between said common connection of said collectors of said first and second transistors and said base of said third transistor, and said first potential source;

a third resistor connected between said base of said second transistor and said first potential source;

a data-in terminal for receiving a binary data bit to be written into said bistable circuit;

a write control input terminal for receiving a write control signal;

a read control input terminal for receiving a read control signal;

an output terminal for electrically manifesting the binary state of said bistable circuit;

a fourth resistor connected between said output terminal and said first potential source;

a first diode connected between said data-in terminal and said base of said first transistor;

a second diode connected between said base of said first transistor and a common connection between said write control input terminal and said emitter of said second transistor;

a third diode connected between said collector of said third transistor and said base of said second transistor;

a fourth diode connected between said collector of said third transistor and said output terminal; and said memory array including at least one output circuit means, said output circuit means connected to said output terminal for accepting said electrical manifestation of said binary state of said bistable circuit and providing a further modified electrical manifestation of the binary state of said bistable circuit.

5. In a read/write random access memory at least one bistable circuit, said bistable circuit having first and second write ports and first and second read ports, said bistable circuit comprising:

first, second, third and fourth, transistors, each of said first through fourth transistors having an emitter, base and collector, said emitter of said first and second transistors being respectively connected to a reference potential source, said emitter of said fourth transistor being connected to a second potential source, said collectors of said first, second and third transistors and said base of said fourth transistor being connected in common;

a first resistor connected between said base of said first transistor and a first potential source;

a second resistor connected between said base of said second transistor and said first potential source;

a third resistor connected between said common connection of said collectors of said first, second and third transistors and said base of said fourth transistor, and said first potential source;

a fourth resistor connected between said base of said third transistor and said first potential source;

said first write port including a first data-in terminal for receiving a binary data bit to be written into said bistable circuit and a first write port control terminal for receiving a first write port control signal;

said second write port including a second data-in terminal for receiving a binary data bit to be written into said bistable circuit and a second write port control terminal for receiving a second write port control signal;

a write control input terminal for receiving a write control signal said write control input terminal being connected to said emitter of said third transistor;

said first read port including a first read port control signal terminal for receiving a first read port control signal and a first read port output terminal for electrically manifesting the binary state of said bistable circuit;

said second read port including a second read port control signal terminal for receiving a second read port control signal and a second read port output terminal for electrically manifesting the binary state of said bistable circuit;

a fifth resistor conected between said first read port output terminal and said first potential source;

a sixth resistor connected between said second read port output terminal and said first potential source;

a first diode connected between said first data-in terminal of said first read port and said base of said first transistor; a second diode connected between said first write port control terminal and said base of said first transistor;

a third diode connected between said base of said first transistor and said common connection of said write control input terminal and said emitter of said third transistor;

a fourth diode connected between said second data-in terminal of said second read port and said base of said second transistor;

a fifth diode connected between said second write port control terminal and said base of said second transistor;

a sixth diode connected between said base of said second transistor and said common connection of said write control input terminal and said emitter of said third transistor;

a seventh diode connected between the base of said third transistor and the collector of said fourth transistor;

an eighth diode connected between said collector of said fourth transistor and said first read port output terminal;

a ninth diode connected between said first read port control signal terminal and said first read port output terminal;

a tenth diode connected between said collector of said fourth transistor and said second read port output terminal;

an eleventh diode connected between said second read port output terminal and said second read port output terminal; and, said memory array including at least first and second output circuit means, said first output circuit means being connected to said first read port output terminal for accepting said electrical manifestation appearing at said first read port output terminal and providing a further modified electrical manifestation of the binary state of said bistable circuit, and said second output circuit means being connected to second read output terminal for accepting said electrical manifestation appearing at said second read port terminal and providing a further modified electrical manifestation of the binary state of said bistable circuit.

6. In a read/write random access memory at least one bistable circuit, as recited in claim 4, wherein said memory array at least one output circuit means includes:

fourth, fifth, sixth and seventh transistors, each of said fourth, fifth, sixth and seventh transistors having an emitter, base and collector, said base of said fourth transistor being connected to said output terminal of said bistable circuit, said collector of said fourth transistor being connected to said first potential source, said emitter of said fourth transistor being connected to said emitter of said fifth transistor, said base of said fifth transistor being connected in common to said base of said sixth transistor, said collector of said fifth transistor being connected to said base of said seventh transistor, said emitter of said seventh transistor being connected to said second potential source;

a fifth resistor connected between said collector of fifth transistor and said first potential source;

a sixth resistor connected between said common connection of said bases of said fifth and sixth transistors and said first potential source;

a seventh resistor connected between said collector of said seventh transistor and said first potential source;

an eighth resistor connected between said collector of said sixth transistor and said first potential source;

a ninth resistor connected between said emitter of said fifth transistor and said second potential source;

a tenth resistor connected between said emitter of said sixth transistor and said second potential source; and, an output terminal for the output circuit means, said output terminal of said output circuit means being connected to said collector of said seventh transistor.

7. In a read/write random access memory array having m columns of memory cells and n rows of memory cells, as recited in 3, wherein each of said m×n memory cells comprise:

first, second and third transistors each of said first, second and third transistors having an emitter, base and collector, said collectors of said first and second transistors and said base of said third transistor being connected in common, said emitter of said first transistor being connected to a reference source of potential, said emitter of said third transistor being connected to a second potential source;

a first resistor connected between said base of said first transistor and a first potential source;

a second resistor connected between said common connection of said collectors of said first and second transistors and said base of said third transistor, and said first potential source;

a third resistor connected between said base of said second transistor and said first potential source;

a data-in terminal for receiving a binary data bit to be written into said bistable circuit;

a write control input terminal for receiving a write control signal;

a read control input terminal for receiving a read control signal;

an output terminal for electrically manifesting the binary state of said bistable circuit;

a fourth resistor connected between said output terminal and said first potential source;

a first diode connected between said data-in terminal and said base of said first transistor;

a second diode connected between said base of said first transistor and a common connection between said write control input terminal and said emitter of said second transistor;

a third diode connected between said collector of said third transistor and said base of said second transistor;

a fourth diode connected between said collector of said third transistor and said output terminal;

8. In a read/write random access memory array, said memory array having m columns of memory cells and n rows of memory cells where m and n are positive integers and said memory array includes m×n memory cells said memory array comprising:

m×n cells arranged in an array having m columns and n rows, each of said memory cells having a first write port data-in terminal, a first write port control terminal, a second write port data-in terminal, a second write port control terminal, a write control terminal, a first read port control terminal, a second read port control terminal, a first read port data out terminal and a second read port data out terminal;

n groups of control lines, each group of said n group of control lines be associated with a descrete one of said n rows of memory cells, each group of said n group of control lines including a first write port control line for receiving a first write port control signal, a second write port control line for receiving a second write port control signal, a write control line for receiving a write control signal, a first read port control line for receiving a first read port control signal and a second read port control line for receiving a second read port control signal, each of said n first write port control lines being connected to said first write port control terminal of the m memory cells of the row of memory cells associated with said one of n first write port control lines, each of said n second write port control lines being connected to the second write port control terminal of the m memory cells of the row of memory cells associated with said one of said n second write port control lines, each of said n write control lines being connected to the write control terminal of the m memory cells of the row of memory cells associated with said one of said n write control lines, each of said n first read port control lines being connected to the first read port control terminal of the m memory cells of the row of memory cells associated with said one of said n first read port control lines, and each of said n second read port control lines being connected to the second read port control terminal of the m memory cells of the row of memory cells associated with said one of said n second read port control lines;

a first group of m output circuit means each output circuit means of said first group of m output circuit means being associated with a discrete one of said m columns of memory cells, each output circuit means of said first group of m output circuit means being connected to the first read port data out terminal of the n memory cells of the column of memory cells associated with said one of said first group of m output circuit means; and, a second group of m output circuit means each output circuit means of said second group of m output circuit means being associated with a discrete one of said m columns of memory cells, each output circuit means of said second group of m output circuit means being connected to the second read port data terminal of the n memory cells of the column of memory cells associated with said one of said second group of m output circuit means.

9. In a read/write random access memory array, said memory array having m columns of memory cells and n rows of memory cells where m and n are positive integers and said memory array includes m×n memory cells, said memory array comprising:

m×n memory cells arranged in an array having m columns and n rows, each of said memory cells having a data-in terminal, a write control input terminal, a read control input terminal, and an output terminal;

n pairs of control lines, each pair of said n pairs of control lines being associated with a discrete one of said n rows of memory cells, each pair of said n pairs of control lines including a write control line for receiving a write control signal and a read control line for receiving a read control signal, each of said n write control lines of said n pairs of control lines being connected to the write control input terminal of the m memory cells of the row of memory cells associated with said one of said n write control lines, and each of said n read control lines of said n pairs of control lines being connected to the write control input terminal of the m memory cells of the row of memory cells associated with said one of said n read control lines;

n write control circuit means, each of said n write control circuit means being connected to a discrete one of said n write control lines, each of said n write control circuit means, when selected, providing said write control signal;

n read control circuit means, each of said n read control circuit means being connected to a discrete one of said n read control circuit means, each of said n read control circuit means, when selected, providing said read control signal, m output circuit means, each of said m output circuit means being associated with a discrete one of said m columns of memory cells, each of said m output circuit means being connected to the output terminal of the n memory cells of the column of memory cells associated with said output circuit means:

a write control decoder circuit means, said write control decoder means having $k+1$ inputs, where $2^k = n$ is an integer, and n outputs, each of said n outputs of said write control decoder circuit means being connected to a discrete one of said n write control circuits, where said $k+1$ inputs of said write control decoder circuit means comprises a k bit write address of a row of memory cells to be written and a memory array write control signal; and, a read control decoder circuit means, said read control decoder circuit means having $k+1$ inputs and n outputs, each of said n outputs of said read control decoder circuit means being connected to a discrete one of said n read control circuits, where said $k+1$ inputs of said read control decoder circuit means comprises a k bit read address of a row of memory cells to be read and a memory array read control signal.

10. In a read/write random access memory array, said memory array having m columns of memory cells and n rows of memory cells, where m and n are integers, and said memory array includes m×n memory cells, said memory array comprising:

m×n memory cells arranged in an array having m columns and n rows, each of said memory cells having a first write port data-in terminal, a first write port control terminal, a second write port data-in terminal, a second write port control terminal, a write control terminal, a first read port control terminal, a second read port control terminal, a first read port output terminal and a second read port output terminal;

n groups of control lines, each group of said n groups of control lines be associated with a discrete one of said n rows of memory cells, each group of said n groups of control lines including a first write port control line for receiving a first write port control signal, a second write port control line for receiving a second write port control signal, a write control line for receiving a write control signal, a first read port control line for receiving a first read port control signal and a second read port control line for receiving a second read port control signal, each of said n first write port control lines being connected to the first port control terminal of the m memory cells of the row of memory cells associated with said one of n first write port control lines, each of said n second write port control lines being connected to the second write port control terminal of the m memory cells of the row of memory cells associated with said one of said n second write port control lines, each of said n write control lines being connected to the write control terminal of the m memory cells of the row of memory cells associated with said one of said n write control lines, each of said n first read port control lines being connected to the first read port control terminal of the m memory cells of the row of memory cells associated with said one of said n first read control lines, each of said n second read port control lines being connected to the second read port control terminal of the m memory cells of the row of memory cells associated with said one of said n second read port control lines;

n first write port control circuit means, each of said n first write port control circuit means being connected to a discrete one of said n first write port control lines, each of said n first write port control circuit means, when selected, providing said first write port control signal;

n second write port control circuit means, each of said n second write port control circuit means being connected to a discrete one of said n second write port control lines, each of said n second write port control circuit means, when selected, providing said second write port control signal means;

n first read port control circuit means, each of said n first read port control circuit means being connected to a discrete one of said n first read port control lines, each of said n first read port control circuit means, when selected, providing said first read port control signal;

n second read port control circuit means, each of said n second read port control circuit means being connected to a discrete one of said n second read port control lines, each of said n second read port control circuit means, when selected, providing said second read port control signal;

a first write port control decoder circuit means, said first write control decoder circuit means having $k+1$ inputs, where k is a positive integer and $2^k = n$ and n outputs, each of said n outputs of said first write control decoder circuit means being connected to a discrete one of said n first write port control circuit means, said $k+1$ inputs of said first write control decoder circuit means comprising, a k binary bit first write port address of a row of memory cells to be written via their first write ports and a memory array first write port control signal;

a second write port control decoder circuit means, said second write port control decoder circuit means having $k+$ inputs, and n outputs, each of said n outputs of said second write port control decoder circuit means being connected to a discrete one of said n second write port control circuit means, said $k+1$ inputs of said second write control decoder circuit means comprising, a k binary bit second write port address of a row of memory cells to be written via their second write ports and a memory array second write port control signal;

a first read port control decoder circuit means, said first read port control decoder circuit means having $k+1$ inputs, and n outputs, each of said n outputs of said first read port control decoder circuit means being connected to a discrete one of said n first read port control circuit means, said $k+1$ inputs of said first read port control decoder circuit means comprising, a k binary bit first read port address of a row of memory cells to be read via their first read ports and a memory array first read port control signal;

a second read port control decoder circuit means, said second read port control decoder circuit means having $k+1$ inputs, and n outputs, each of said n outputs of said second read port control decoder circuit means being connected to a discrete one of said n second read port control circuit means, said $k+1$ inputs of said second read port control circuit means comprising, a k binary bit second write port address of a row of memory cells to be read via their second read ports and a memory array second read port control signal;

a first group of m output circuit means, each of said output circuit means of said first group of m output circuit means being associated with a discrete one of said m columns of memory cells, each of said output circuit means of said first group of m output circuit means being connected to the first read port out terminal of the n memory cells of the column of memory cells associated with said one of said first group of m output circuit means; and, a second group of m output circuit means, each of said output circuit means of said second group of m output circuit means being associated with a discrete one of said m columns of memory cells, each of said output circuit means of said second group of m output circuit means being connected to the second read port terminal of the n memory cells of the column of memory cells associated with said one of said second group of m output circuit means.

11. In a read/write random access memory array having m columns of memory cells and n rows of memory cells, as recited in claim 9, wherein each of said $m \times n$ memory cells comprise:

first, second and third transistors each of said first, second and third transistors having an emitter, base and collector, said collectors of said first and second transistors and said base of said third transistor being connected in common, said emitter of said first transistor being connected to a reference source of potential, said emitter of said third transistor being connected to a second potential source;

a first resistor connected between said base of said first transistor and a first potential source;

a second resistor connected between said common connection of said collectors of said first and second transistors and said base of said third transistor, and said first potential source;

a third resistor connected between said base of said second transistor and said first potential source;

a data-in terminal for receiving a binary data bit;

a write control input terminal for receiving a write control signal;

a read control input terminal for receiving a read control signal;

an output terminal for manifesting the binary state of said bistable circuit;

a fourth resistor connected between said output terminal and said first potential source;

a first diode connected between said data-in terminal and said base of said first transistor;

-a second diode connected between said base of said first transistor and a common connection between said write control input terminal and said emitter of said second transistor;

a third diode connected between said collector of said third transistor and said base of said second transistor; and a fourth diode connected between said collector of said third transistor and said output terminal.

12. In a read/write random access memory array having m columns of memory cells and n rows of memory cells, as recited in claim 10, wherein each of said m×n memory cells comprise:

first, second, third and fourth transistors, each of said first through fourth transistors having an emitter, base and collector, said emitter of said first and second transistors being respectively connected to a reference potential source, said emitter of said fourth transistor being connected to a second potential source, said collectors of said first, second and third transistors and said base of said fourth transistor being connected in common;

a first resistor connected between said base of said first transistor and a first potential source;

a second resistor connected between said base of said second transistor and said first potential source;

a third resistor connected between said common connection of said collectors of said first, second and third transistors and said base of said fourth transistor, and said first potential source;

a fourth resistor connected between said base of said third transistor and said first potential source;

said first write port including a first data-in terminal for receiving a binary data bit to be written into said bistable circuit and a first write port control terminal for receiving a first write port control signal;

said second write port including a second data-in terminal for receiving a binary data bit to be written into said bistable circuit and a second write port control terminal for receiving a second write port control signal;

a write control input terminal for receiving a write control signal said write control input terminal being connected to said emitter of said third transistor;

said first read port including a first read port control signal terminal for receiving a first read port control signal and a first read port output terminal for electrically manifesting the binary state of said bistable circuit;

said second read port including a second read port control signal terminal for receiving a second read port control signal and a second read port output terminal for electrically manifesting the binary state of said bistable circuit;

a fifth resistor conected between said first read port output terminal and said first potential source;

a sixth resistor connected between said second read port output terminal and said first potential source;

a first diode connected between said first data-in terminal of said first read port and said base of said first transistor;

a second diode connected between said first write port control terminal and said base of said first transistor;

a third diode connected between said base of said first transistor and said common connection of said write control input terminal and said emitter of said third transistor;

a fourth diode connected between said second data-in terminal of said second read port and said base of said second transistor;

a fifth diode connected between said second write port control terminal and said base of said second transistor;

a sixth diode connected between said base of said second transistor and said common connection of said write control input terminal and said emitter of said third transistor;

a seventh diode connected between the base of said third transistor and the collector of said fourth transistor;

an eighth diode connected between said collector of said fourth transistor and said first read port output terminal;

a ninth diode connected between said first read port control signal terminal and said first read port output terminal;

a tenth diode connected between said collector of said fourth transistor and said second read port output terminal; and, an eleventh diode connected between said second read port output terminal and said second read port output terminal.

* * * * *